(12) United States Patent
Noone et al.

(10) Patent No.: US 8,507,862 B2
(45) Date of Patent: Aug. 13, 2013

(54) LOW PROFILE LIGHT COLLIMATOR MICRO BAFFLE AND METHOD

(75) Inventors: David Robert Noone, Delray Beach, FL (US); Richard Glenn Havass, Coconut Creek, FL (US); Ricci Silvio Cerasini, Plantation, FL (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 243 days.

(21) Appl. No.: 13/034,874

(22) Filed: Feb. 25, 2011

(65) Prior Publication Data

US 2012/0217397 A1   Aug. 30, 2012

(51) Int. Cl.
   *G01J 1/06*   (2006.01)
(52) U.S. Cl.
   USPC .............. 250/338.1; 250/237 R; 250/208.2
(58) Field of Classification Search
   USPC ...................................... 250/338.1
   See application file for complete search history.

(56) References Cited

U.S. PATENT DOCUMENTS

| | | | |
|---|---|---|---|
| 3,869,615 A | | 3/1975 | Hoover et al. |
| 4,288,697 A | * | 9/1981 | Albert .................. 250/505.1 |
| 4,465,540 A | * | 8/1984 | Albert .................... 156/252 |
| 4,498,767 A | | 2/1985 | McGovern et al. |
| 4,585,342 A | * | 4/1986 | Lin et al. .................. 356/124 |
| 4,948,969 A | * | 8/1990 | Yokota ...................... 250/239 |
| 7,053,355 B2 | * | 5/2006 | Ye et al. ................... 250/208.1 |
| 7,425,695 B2 | * | 9/2008 | Theiss et al. ............. 250/214.1 |
| 2005/0083587 A1 | | 4/2005 | Uyeama |
| 2007/0080289 A1 | | 4/2007 | Theiss et al. |

FOREIGN PATENT DOCUMENTS

| | | |
|---|---|---|
| EP | 0335068 A2 | 10/1989 |
| EP | 0363520 A1 | 4/1990 |

OTHER PUBLICATIONS

EPO International Search Report dated May 21, 2012 for corresponding appln PCT/US12/000065.

* cited by examiner

*Primary Examiner* — David Porta
*Assistant Examiner* — Djura Malevic
(74) *Attorney, Agent, or Firm* — Alan M. Weisberg; Christopher & Weisberg, P.A.

(57) ABSTRACT

A light sensor including a substrate and one or more low profile baffle plates, the baffle plates including collimator holes to allow intended light to strike the light detector of the substrate while preventing extraneous light from striking the detector. The baffle plates are disposed above the substrate, on a shroud, which covers a portion of the substrate but allows intended light to pass through the collimator holes onto the light detector. By stacking baffle plates having a thin, low profile, one on top of another upon the shroud, extraneous light striking the material at an angle between the collimator holes cannot enter the sensor while intended light in the substantial front of the sensor enters the sensor through the collimator holes and can be detected by the light detector.

20 Claims, 5 Drawing Sheets

LOW PROFILE LIGHT COLLIMATOR MICRO BAFFLE AND METHOD

CROSS-REFERENCE TO RELATED APPLICATION n/a

STATEMENT REGARDING FEDERALLY SPONSORED RESEARCH OR DEVELOPMENT n/a

FIELD OF THE INVENTION

The present invention relates generally to sensors, and more specifically to an apparatus and method for a baffle that limits the amount of extraneous light received by the sensor.

BACKGROUND OF THE INVENTION

Electromagnetic detectors or sensors such as those commonly used in light detector systems are commonly known in the art. One type of light detector system uses infrared detectors to detect the presence of infrared light. One diode sends out an infrared light signal. A second infrared LED detector produces a small electric signal when it receives an infrared light signal. When an object comes within range of the emitted signal, it reflects the light back onto the detector LED. This causes the detector LED to produce an electric signal that is sent into the detection system. In other light detection systems, a light emitter transmits a beam of light across a detection region where the light is detected by a light detector. If an object, e.g., a person, interrupts the light beam, the light detector senses the interruption, thus indicating the presence of an object or person within the detection region (referred to as a "beam break"). Infrared light detector systems are thus often used in motion detection, people detection or "people counting" systems that may be part of larger security systems.

Light detectors or sensors such as those used in infrared light detector systems typically have an incident viewing angle of close to 180 degrees, making the light barrier (and beam break) of the sensor susceptible to interference caused by extraneous light sources, which may contain the infrared wavelength, such as sunlight, neon signs, and automatic door openers. Often, a light barrier system incorporates a shroud used to block light exceeding the desired angle of incidence, having an aperture with an aspect ratio of depth greater than the width, e.g., a cylinder, so that the sensor only receives light from the intended emitter that is directly across from the sensor. However, due to the size of the hardware used on the sensor and the extremely limited space the sensor may occupy, the maximum height of the light shroud cannot exceed certain dimensions, such as, for example, 0.763 mm (0.03 inches). Many of the sensors currently using shrouds to block some of the unwanted light from extraneous light sources exceed this maximum thickness, rendering the sensor virtually useless in many light detection systems.

Therefore, what is needed is a mechanism that blocks the unwanted light impinging upon the sensor of the light detector system, yet allows enough intended light through for the sensor to work efficiently while complying with thickness and design constraints.

SUMMARY OF THE INVENTION

The present invention advantageously provides a sensor for use with a light detection system that may be part of a larger electronic article surveillance ("EAS") system. The sensor blocks unwanted, extraneous light that might interfere with the intended light detected by the sensor. The sensor includes one or more baffle plates placed upon a shroud which covers at least a portion of the sensor substrate. The baffle plates have a plurality of holes therein such that the holes of one baffle plate are aligned with the holes of other baffle plates in the stack. The stacked baffle plates allow light to strike the light detector of the substrate from substantially in front of the sensor while serving to block or inhibit light coming from an extraneous source to the side of the sensor from striking the light detector.

In one aspect of the invention, a light sensor is provided. The light sensor includes a substrate having a detector for detecting an arrival and an interruption of incoming light, and at least one baffle plate disposed above the substrate. The at least one baffle plate includes material for preventing light from striking the detector and a plurality of collimator holes disposed within the material.

In another aspect of the invention, a detection system is provided. The detection system includes a light transmitter and a light sensor situated proximate an interrogation region, the light sensor oriented to receive light emitted by the light transmitter. The light sensor includes a substrate, the substrate including a detector for detecting an arrival and an interruption of the emitted light, and at least one baffle plate disposed above the substrate, the at least one baffle plate including material for preventing light from striking the detector, and a plurality of collimator holes disposed within the material. The detection system also includes a system controller in communication with the light sensor, the system controller receiving information from the light sensor to detect interruption of the emitted light.

In accordance with yet another aspect, the present invention provides a light baffle having a plate. The plate has a thickness and a plurality of collimator holes disposed therein. The diameter of each of the collimator holes is no less than substantially 1.2 times the thickness, and the distance from the edge of any collimator hole to the edge of another collimator hole is no less than substantially 0.9 times the thickness.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

Figure 1:
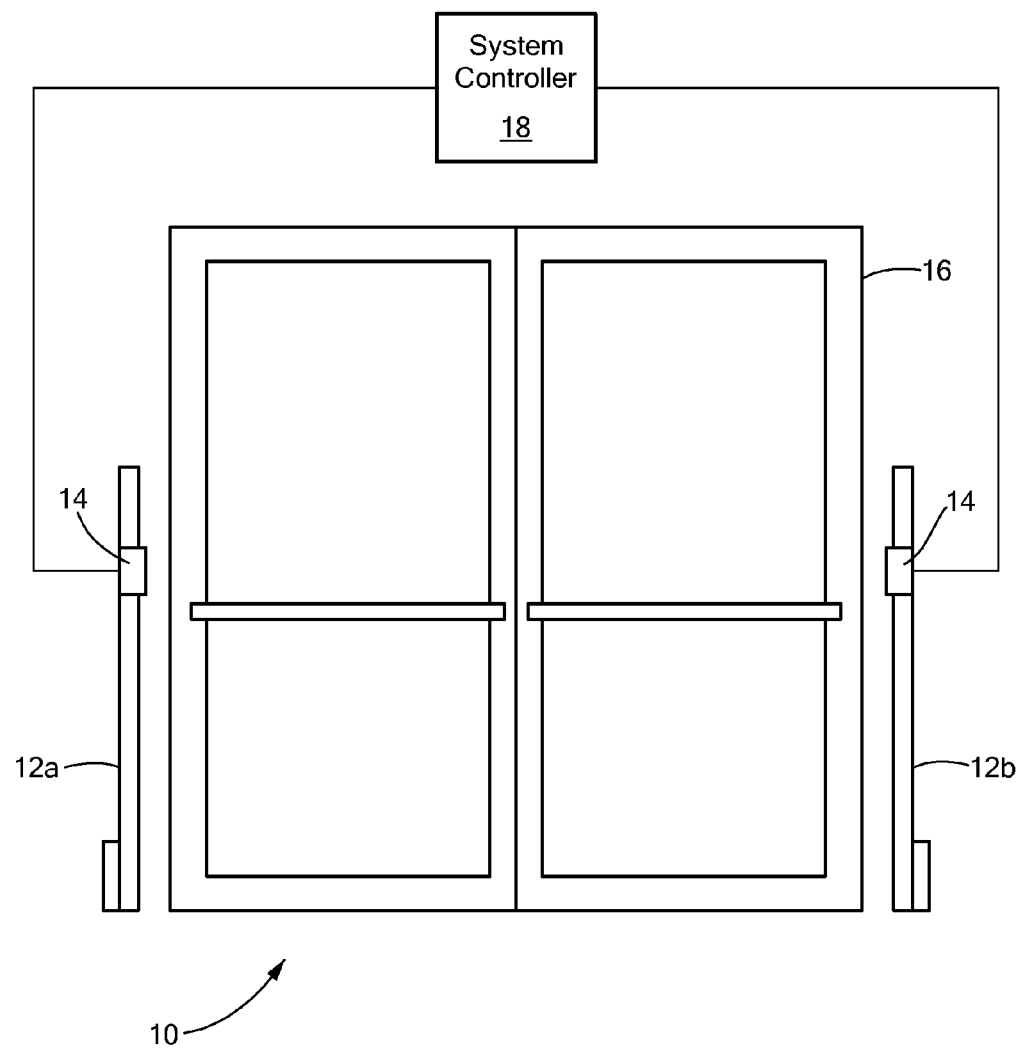
FIG. 1 is a diagram of a people counting system constructed in accordance with the principles of the present invention.

Before describing in detail exemplary embodiments that are in accordance with the present invention, it is noted that the embodiments reside primarily in combinations of apparatus components and processing steps related to providing a sensor for use with light detection systems, such as, for example, people counting systems, that blocks unwanted, extraneous light that might interfere with the intended light detected by the sensor.

Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

One embodiment of the present invention advantageously provides a sensor for use with light detection systems, for example, an infrared people counting system that may be part of a larger electronic article surveillance ("EAS") system, that blocks unwanted, extraneous light that might interfere with the intended light detected by the sensor. The present invention provides one or more baffle plates placed upon a shroud which covers at least a portion of the sensor substrate. The baffle plates have a plurality of holes therein such that the holes of one baffle plate are aligned with the holes of other baffle plates in the stack. The stacked baffle plates allow light to strike the light detector of the substrate from substantially in front of the sensor while serving to block or inhibit light coming from an extraneous source to the side of the sensor from striking the light detector. By stacking multiple baffle plates on top of each other and by orienting the size and number of the baffle plate holes within each baffle plate, unwanted light can be blocked, and intended light can be received by the sensor's light detector. Because each baffle plate has a thin profile, stacking multiple plates upon the shroud and substrate will be well within the light detection system's size and design requirements, while providing an efficient light detection system.

Referring now to the drawing figures in which like reference designators refer to like elements, there is shown in FIG. 1 an exemplary configuration of a light detection system 10 constructed in accordance with the principles of the present invention and located, for example, at a facility exit/entrance. System 10 may be any light detection system that utilizes light within the visible, infrared, or ultraviolet light spectrum. System 10 may be used in a people counting system or motion detection system often used by retail stores to maintain statistics regarding the number of shoppers entering the store, when they enter, when they leave, etc. System 10 need not be located at or near the store entrance but may be located at various locations throughout a store, such as proximate specific departments, or shopping bins. In one embodiment, system 10 includes a pair of pedestals 12a and 12b (collectively referred to as pedestal 12), located a known distance apart, each having a light sensor 14. Sensors 14 may be located anywhere on pedestals 12. In other embodiments, sensors 14 need not be located on pedestals but may be mounted on other objects.

System 10 may also be part of an electronic article surveillance ("EAS") detection system. In an EAS system, antennas and light sensors 14 are mounted on pedestals 12 and are electrically coupled to a control system, which controls the operation of the EAS detection system. Note that instead of, or in addition to, the EAS detection system, a radio frequency identification ("RFID") system may be implemented to identify an item with an activated tag within an RFID interrogation zone.

Each sensor 14 may include one or more transmitters that transmit a light beam such as, for example, an infrared light beam across an entrance such as near doors 16 by the entrance/exit of a store. Alternately, the transmitter emitting light beams may be located separately from sensor 14. Sensors 14, which could be mounted on pedestals 12 although they may be situated at other locations or on other objects proximate doors 16, also include a light detector which could be a receiver or a reflector that receives and detects the beam of light. Any interruption in the beam of light directed toward sensor 14 is detected by the light detector of sensor 14.

Sensor 14 is in electrical communication with a system controller 18 and/or an alarm system (not shown). System controller 18 includes a computer, memory, data storage and the necessary hardware and software needed to receive transmitted information from sensors 14 and to determine the number of people passing a monitored region. System controller 18 may also be in communication with an alarm system in case controller 18 determines that people have entered the monitored region during certain hours e.g., after the store is closed, since this may signify unauthorized entry into the store. In the embodiment of FIG. 1, each sensor 14 includes an emitter which transmits light signals to the other sensor 14. When a person crosses the path between the sensors 14, sensor 14 determines that there is an interruption of the incoming light beam and transmits signals to signal controller 18. Based upon the information received from sensors 14, system controller 18 can determine when and how often these interruptions occur and keep track of each interruption, i.e., each time a person walks between pedestals 12. While sensor 14 is designed to detect receipt of light signals from an intended light source within system 10, receipt by sensor 14 of extraneous light from a source other than the intended source may lead to false readings.

Figure 2:
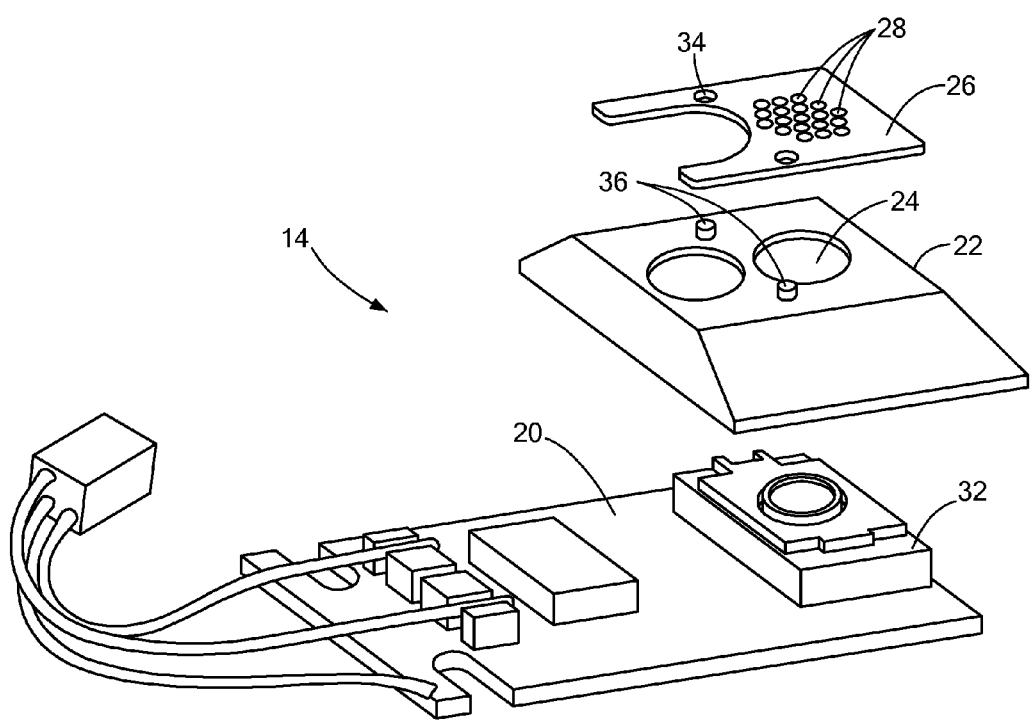
FIG. 2 is an exploded view of a sensor constructed in accordance with the principles of the present invention including substrate, shroud and baffle plate components.

FIG. 2 illustrates the components of sensor 14. Sensor 14 includes a circuit board or substrate 20. Substrate 20 includes a detector 32 for detecting incoming light, and the hardware and for communicating with a remote computer, e.g., system controller 18, in order to transmit information used to determine the number of times that incoming light from a transmitter was interrupted. At least a portion of substrate 20, including detector 32, is covered by a shroud 22, which includes one or more apertures 24 that allow a beam of light to strike detector 32 of substrate 20. Shroud 22 provides some filtering of extraneous light since light not entering the apertures 24 is not detected by detector 32. Shroud 22 may be secured to or affixed to substrate 20 in any number of ways known in the art or oriented to cover at least a portion of substrate 20. Shroud may be of varying dimensions and sized to cover substrate 20 yet not interfere with any of the other components of substrate 20. Shroud 22 provides a material such as polymer, upon which one or more baffle plates 26 may be secured.

FIG. 2 also shows baffle plate 26, which is placed upon or affixed to shroud 22. Baffle plate 26, which is described in greater detail below, can be secured to shroud 22 by any number of attachment mechanisms including glue or other adhesives known in the art. Baffle plate 26 includes a plurality of collimator holes 28 which allow incoming light to travel though through the apertures 24 in shroud 22 and be detected by detector 32 of substrate 20. Each baffle plate 26 includes one or more registration holes 34 (also shown in FIG. 4) in order to receive a corresponding registration post 36. Registration post 36 secures baffle plate 26 to shroud 22. In one embodiment, shroud 22 includes two registration posts 36 and each baffle plate 26 includes two corresponding registration holes.

Figure 3:
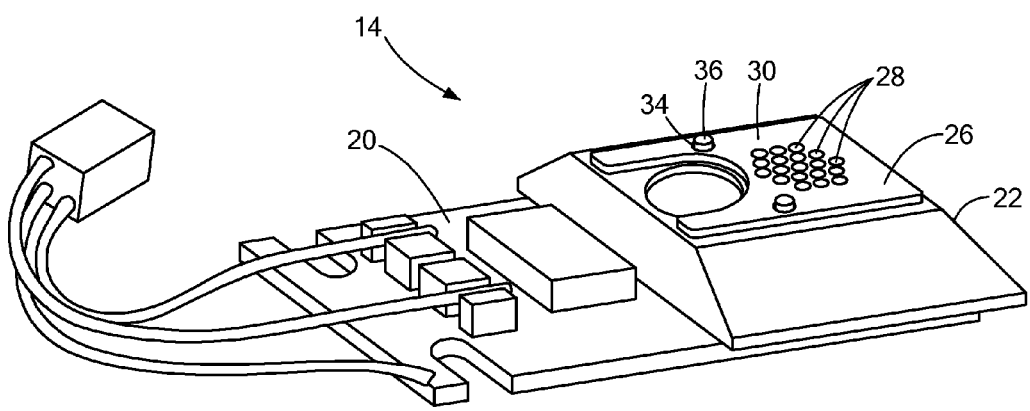
FIG. 3 is a perspective view of the sensor of FIG. 2.

FIG. 3 shows the components of sensor 14, i.e., substrate 20, shroud 22, and baffle plate 26, placed together to form sensor 14. Shroud 22 and baffle plate 26 cover the portion of substrate 20 that includes detector 32. As can be seen from this view, baffle plate 26 includes material 30 interdisposed between and around collimator holes 28. Material 30 prevents light from entering through baffle plate 26 and being detected by detector 32. Thus, light entering tangentially, e.g., from an oblique angle rather than from substantially in front of sensor 14 cannot pass through baffle plate 26 and shroud 22 and therefore cannot be detected by light detector 32. Light emitted by an unwanted light source will be blocked by material 30 and be prevented from striking detector 32. In this fashion, during use, sensors 14 are aligned so that they can receive light from a light source substantially in front of sensor 14 while being prevented from receiving light from extraneous light sources.

Figure 4:
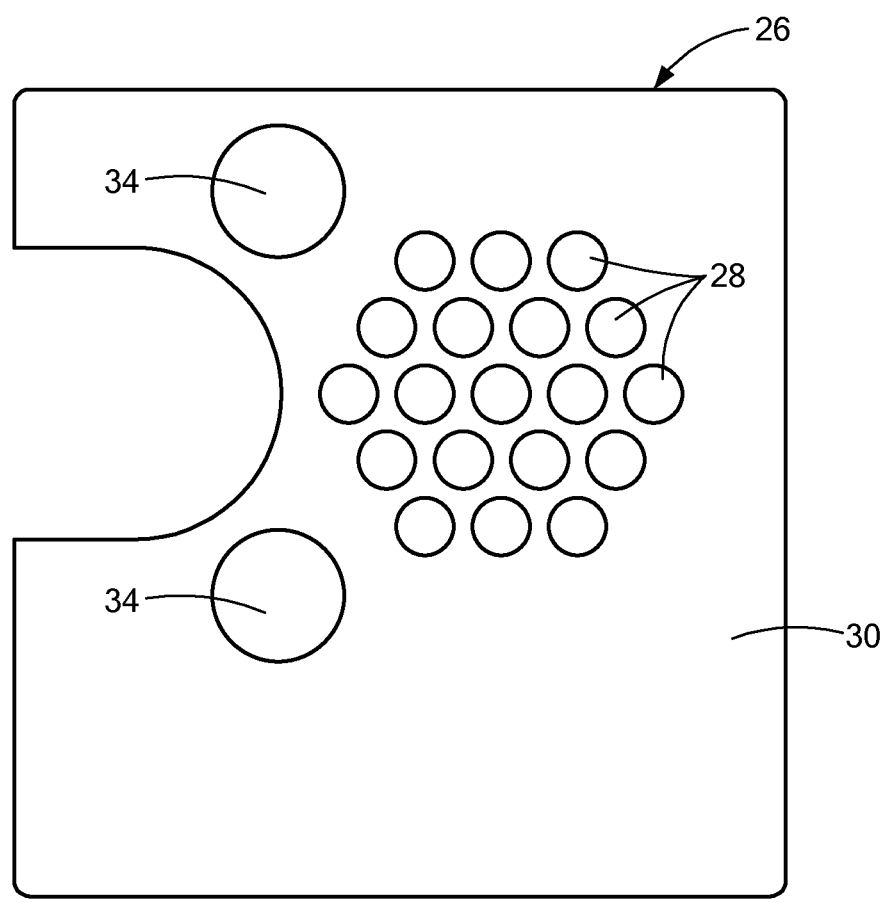
FIG. 4 is a top view of the baffle plate of FIG. 2 having a plurality of light-emitting collimator holes therein.

Sensor 14 includes one or more baffle plates 26, which, in the case when multiple plates are utilized, can be stacked one on top of another. FIG. 4 shows en exemplary baffle plate 26 used in accordance with the present invention. Baffle plate 26, in one embodiment, is etched with circular collimator holes 28, and may stacked one on top of another to form multiple levels in order to collimate the incoming light beams. Baffle plate 26 is made of metallic material 30, e.g., stainless steel. Collimator holes 28 can be formed of different sizes and shapes and arranged in varying patterns. By making collimator holes 28 smaller than the thickness of baffle plate 26, the angle of light allowed to pass through collimator holes 28 can be adjusted. By adding or removing baffle plates 26, the angle of light allowed to pass through collimator holes 28 can be adjusted without affecting the amount of intended light coming through opposite and substantially in front of sensor 14. In one embodiment, diameter of collimator holes 28 in baffle plate 26 are no less than substantially 1.2 times the thickness of baffle plate 26. In another embodiment, the distance from the edge of any hole 28 to the edge of another hole 28 is no less than substantially 0.9 times the thickness of baffle plate 26. Thus, in one embodiment, in order to achieve a baffle plate 26 having a thickness of 0.763 mm (0.03 inches) with collimator holes 0.71 mm. (0.027 inches) in diameter with the least amount of material 30 between collimator holes 28, where material 30 blocks light from both intended sources and unintended sources, a baffle plate 26 with material 30 having a thickness of 0.254 mm is used.

In another exemplary embodiment, baffle plate 26 is made of stainless steel having dimensions 9.5 mm×7.5 mm'0.254 mm. Baffle plate 26 includes 21 etched circular holes, including 19.71 mm collimator holes 28 and two larger 1.63 mm registration holes 34 used to affix baffle plate 26 to substrate 20 and to align multiple baffle plates 26. The 19 collimator holes 28 are in a substantially hexagonal pattern, although the number and configuration, e.g., pattern of collimator holes 28 can vary and are dependent on the applied usage of sensor 14 and other factors such as the size and dimension of the light detector portion of substrate 20. For example, if the light detector of substrate 20 has a 4 mm diameter, baffle plate 26 can have nineteen collimation holes 28 in a hexagonal pattern to achieve satisfactory coverage., i.e., to permit enough light to enter sensor 14 such that detector 32 of substrate 20 can detect the presence of incoming light. In one embodiment, baffle plate 26 also has an area, e.g., 3.2 mm, notched out on one end, as shown in FIG. 4. This notch is also application-specific and is used to accommodate a light emitter within sensor 14 that such that the transmitted light from sensor 14 will not be blocked by baffle plate 26. The present invention is not limited to any specific orientation, size, or number of collimator holes 28. The arrangement, size and number of collimator holes 28 can be altered depending upon system design factors including for example the relative position of sensors 14 in the light detection system.

The arrangement and size of collimator holes 28 as well as the dimensions including thickness of baffle plate 26 advantageously allow the entrance of light substantially across from the sensor 14 to be received and detected by light detector 32 while blocking unwanted extraneous light arriving tangentially toward sensor 14. Advantageously, baffle plates 26 each have a low profile, e.g., a thickness of approximately 254 mm. Thus, even by stacking multiple baffle plates 26 on each other, the overall thickness of the stacked plates will be smaller than traditional cylindrical shrouds. The number and thickness of each baffle plate 26 can be altered, i.e. scaled larger or smaller, with different collimator hole sizes and collimator hole patterns to accommodate different size substrates and detectors and the number of baffle plates 26 can be varied to provide control over a varying viewable area.

Figure 5:
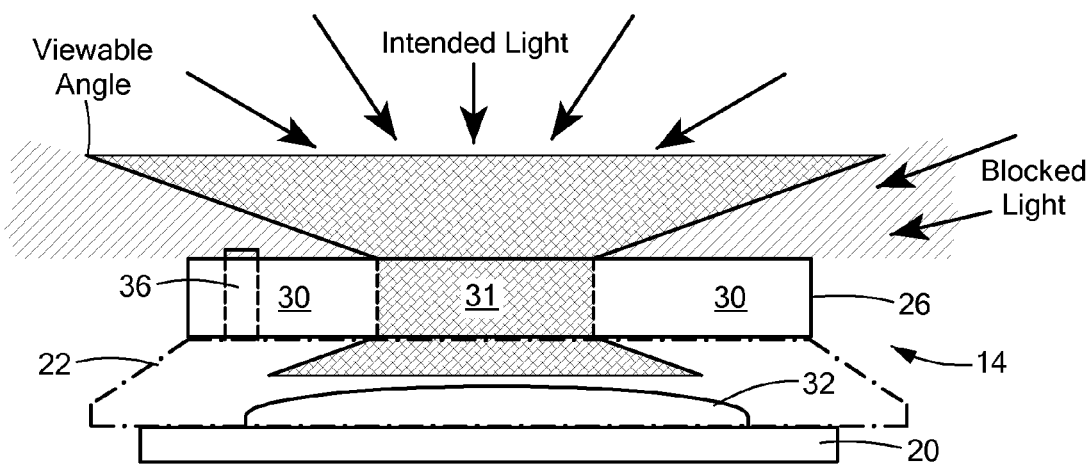
FIG. 5 is a side view of the present invention illustrating the blockage of extraneous light using a single baffle plate on a sensor substrate.

FIG. 5 illustrates an exemplary embodiment of the present invention where one baffle plate 26 is used to filter extraneous and unwanted light from sensor 14 while allowing intended light to enter sensor 14. In the latter case, unwanted light is light incident on plate(s) 26 that exceeds the corresponding viewable angle. Region 31 represents a compilation of collimator holes 28 and material 30 and is shown as a compilation for ease of understanding. Intended light enters region 31 of baffle plate 26 and strikes detector 32 of substrate 20 while unintended light from an extraneous light source striking sensor 14 tangentially is blocked by material 30 of baffle plate 26. As shown in FIG. 5, the baffle plate 26 has a central region 31 having a plurality of collimator holes disposed within the baffle plate material. Surrounding the central region 31 is a concentric region 30 having no collimator holes and having an annular width. The annular width is substantially equal to the diameter of the central region 31. Thus, it is the combination of collimator holes 28 and material 30, represented as region 31 that achieves the desired result of allowing the intended light to strike detector 32. Unintended light is preventing from striking detector 32 due to material 30 on either side of region 31, where material 30 does not include any collimator holes as well as material 30 between collimator holes 28. Shroud 22 is disposed over at least a portion of substrate 20, between substrate 20 and baffle plate 26, and includes one or more registrations post 36. As will be seen in FIGS. 6 and 7 and discussed below, registration posts 36 also serve to align multiple baffle plates 26, stacked one on top of another, on shroud 22.

As seen in FIG. 5, light arriving from oblique angles is blocked by the material 30 of baffle plate 26 and therefore cannot be detected by detector 32. The arrangement of collimator holes 28 provide a viewable angle of intended light, i.e., light that sensor 14 is intended to receive, while blocking out unintended light, i.e., light coming from other sources that inadvertently might be detected by detector 32. The viewable angle can be adjusted depending upon the arrangement of collimator holes 28 and upon the number of baffle plates 26 stacked upon substrate 20.

Figure 6:
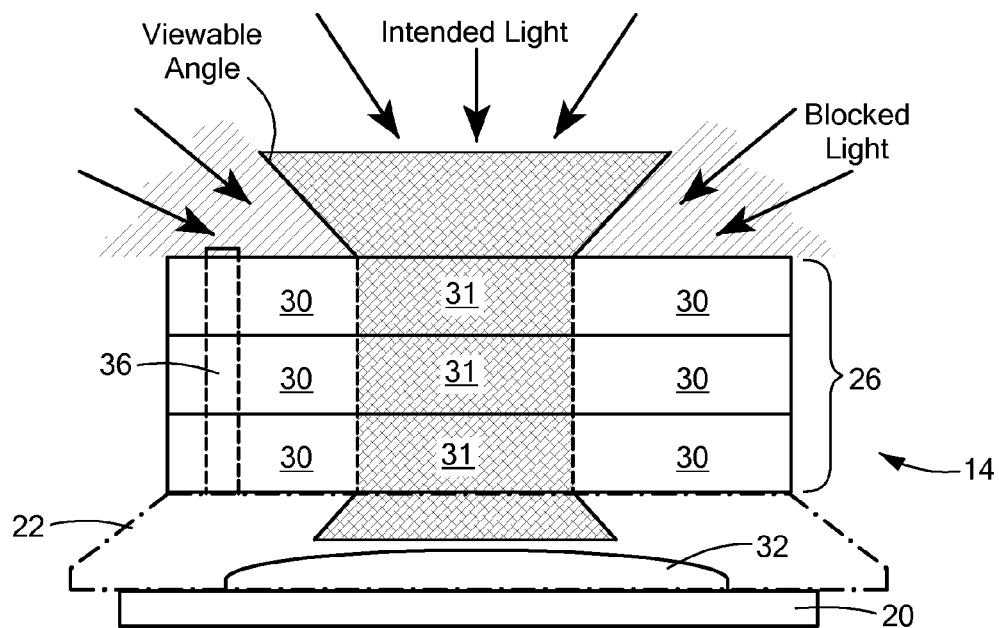
FIG. 6 is a side view of the present invention illustrating the blockage of extraneous light using three baffle plates stacked on a sensor substrate.

FIG. 6 illustrates another embodiment of the present invention whereby more than one, in this case three, baffle plates 26 are stacked upon substrate 20. Here, as the number of baffle plates 26 increases, the viewable angle of intended light is reduced while the amount of blocked, unwanted light is increased, while not affecting/attenuating intended light entry. This embodiment may be used, for example, in light detection systems where the light emitter is directly across from sensor 14 since the viewable angle is not large. When multiple baffle plates 26 are stacked in this configuration, each individual baffle plate 26 includes collimator holes 28 each having a diameter slightly greater than the depth of one baffle plate 26 (e.g., 1.2 times the depth). However, in the stacked configurations shown in FIGS. 6 and 7, the depth of the overall stack of multiple baffle plates 26 has an overall depth greater than the diameter of each collimator hole 28 in order to achieve optimal collimation and desired viewable angle.

Figure 7:
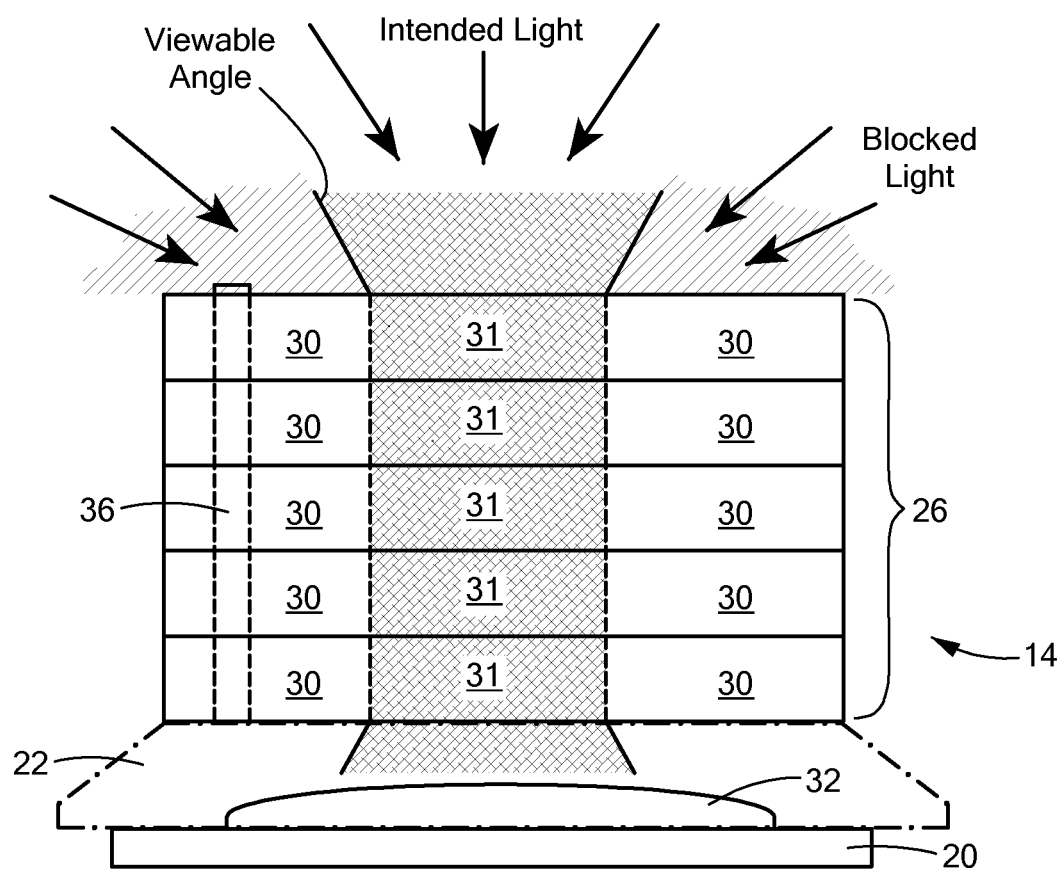
FIG. 7 is a side view of the present invention illustrating the blockage of extraneous light using five baffle plates stacked on a sensor substrate.

FIG. 7 illustrates another embodiment whereby five baffle plates 26 are stacked on top of each other, all above detector 32 of substrate 20. As can be seen from FIGS. 5-7, the thicknesses of the baffle plates 26 determine the viewable angle passing the intended light into the central region 31. It is within the scope of the invention to provide different numbers of baffle plates 26 depending upon the desired angle of viewable light and the amount of unintended blocked light that is required. Shroud 22 may be included beneath baffle plates 26 and above substrate 20 as shown. Shroud 22 acts as a medium upon which baffle plates 26 may be affixed in order to facilitate the alignment of baffle plates 26 such that intended light enters through collimator holes 28 and strike detector 32. Shroud 22 includes one or more apertures 24 and thus the collimator holes 28 are also aligned with apertures 24 in order to allow intended light to be detected by detector 32.

The present invention provides a sensor 14 that can emit and receive light and can detect the interruption of incoming light from an intended light source. Sensor 14 is in communication with system controller 18, which receives transmitted information from sensors 14 and determines, in one embodiment, the number of people passing a given region. Each sensor 14 includes a substrate 20 and one or more baffle plates 26 situated above detector 32 of substrate 20. Each baffle plate 26 includes a number of collimator holes 28 that can be sized and oriented in a specific pattern in order to optimize the amount of light that can enter and impinge upon detector 32. Further, the arrangement of baffle plates 26 upon substrate 20 also serves to block light that may enter sensor 14 tangentially, e.g., from the sides of sensor 14. By arranging the number and arrangement of baffle plates 26 and collimator holes 28 therein, sensor 14 can be used with different sized substrates 20 and detectors 32 to provide optimal filtering of unwanted light from extraneous sources resulting in a more accurate sensing device and people counting or motion detecting system 10 within a given volume of sensor positioning space.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

In addition, unless mention was made above to the contrary, it should be noted that all of the accompanying drawings are not to scale. Significantly, this invention can be embodied in other specific forms without departing from the spirit or essential attributes thereof, and accordingly, reference should be had to the following claims, rather than to the foregoing specification, as indicating the scope of the invention.

What is claimed is:

1. A light sensor, the light sensor comprising:
a substrate, the substrate including a detector for detecting an arrival and an interruption of incoming light; and
at least one baffle plate disposed above the substrate, the at least one baffle plate including:
baffle plate material, the baffle plate material having a thickness and configured to prevent light from striking the detector, the baffle plate material having:
a central region having a plurality of collimator holes disposed within the baffle plate material, the central region having a diameter, the collimator holes configured to pass intended light to the detector; and
a concentric region of the material surrounding the central region, the concentric region having no collimator holes and having an annular width substantially equal to the diameter of the central region, the thickness of the baffle plate determining a viewable angle passing the intended light into the central region.

2. The light sensor of claim 1, further comprising a plurality of baffle plates in a stacked arrangement, wherein the collimator holes of the plurality of baffle plates are aligned.

3. The light sensor of claim 2, further comprising a shroud upon which the plurality of baffle plates are mounted, the shroud enclosing at least a portion of the substrate.

4. The light sensor of claim 3, each of the at least one baffle plate further including one or more registration holes, the shroud further comprising one or more alignment posts, each of the one or more registration holes receiving a registration post to secure the one or more baffle plates to the shroud.

5. The light sensor of claim 1, wherein each of the at least one baffle plate has a thickness and wherein the plurality of collimator holes each have a diameter not less than 1.2 times the thickness of each of the at least one baffle plates.

6. The light sensor of claim 1, wherein the at least one baffle plate each has a thickness and wherein a distance between one of the plurality of collimator holes and another of the plurality of collimator holes is not less than 0.9 times the thickness of the at least one baffle plate.

7. The light sensor of claim 1, the substrate further comprising a light source, wherein the at least one baffle plate each includes a notch therein, the notch being aligned with the light source.

8. The light sensor of claim 1, wherein the plurality of collimator holes are arranged in a hexagonal pattern.

9. The light sensor of claim 1, wherein the detector is an infrared light detector.

10. A detection system, comprising:
a light transmitter;
a light sensor situated proximate an interrogation region, the light sensor oriented to receive light emitted by the light transmitter, the light sensor comprising:

a substrate, the substrate including a detector for detecting an arrival and an interruption of the emitted light; and at least one baffle plate disposed above the substrate, the at least one baffle plate including a baffle plate material having a thickness and configured to prevent light from striking the detector, the baffle plate material including:

a central region having a plurality of collimator holes disposed within the baffle plate material, the central region having a diameter, the collimator holes configured to pass intended light to the detector; and a concentric region of the material surrounding the central region, the concentric region having no collimator holes and having an annular width substantially equal to the diameter of the central region, the thickness of the baffle plate determining a viewable angle passing the intended light into the central region; and a system controller in communication with the light sensor, the system controller receiving information from the light sensor to detect interruption of the emitted light.

11. The system of claim 10, further comprising a electronic article surveillance ("EAS") pedestal proximate the interrogation region, wherein the light sensor is affixed to the pedestal.

12. The system of claim 10, the light sensor further comprising a plurality of baffle plates in a stacked arrangement, wherein the collimator holes of the plurality of baffle plates are aligned.

13. The system of claim 12, wherein the light sensor further comprises a shroud upon which plurality of baffle plates are mounted, the shroud enclosing at least a portion of the substrate.

14. The system of claim 12, wherein a combined depth of the plurality of stacked baffle plates is greater than a diameter of each of the plurality of collimator holes.

15. The system of claim 10, wherein the at least one baffle plate each has a thickness, wherein a distance between one of the plurality of collimator holes and another of the plurality of collimator holes is not less than 0.9 times the thickness of the at least one baffle plate.

16. The system of claim 10, the substrate of each of the light sensors further comprising a light source, wherein the at least one baffle plate each includes a notch therein, the notch being aligned with the light sensor.

17. The system of claim 10, wherein the at least one baffle plate each has a thickness and wherein the plurality of collimator holes each have a diameter not less than 1.2 times the thickness of each of the ate least one baffle plate.

18. The system of claim 10, each of the at least one baffle plate further including one or more registration holes, the light sensor further comprising one or more alignment posts, each of the one or more registration holes receiving a registration post to secure the one or more baffle plates to the substrate.

19. A light baffle, comprising:
a baffle plate, the plate having:
a thickness; and
a baffle plate material
a central region having a plurality of collimator holes disposed within the baffle plate material, the central region having a diameter, the collimator holes configured to pass intended light to the detector; and
a concentric region of the material surrounding the central region, the concentric region having no collimator holes, and having an annular width substantially equal to the diameter of the central region, the thickness of the baffle plate determining a viewable angle passing the intended light into the central region.

20. The light baffle of claim 19, further comprising at least one registration hole, the registration hole facilitating alignment of the collimator holes among a plurality of stacked light baffles.

* * * * *